United States Patent [19]

Suzuki et al.

[11] Patent Number: 5,057,884
[45] Date of Patent: Oct. 15, 1991

[54] SEMICONDUCTOR DEVICE HAVING A STRUCTURE WHICH MAKES PARASITIC TRANSISTOR HARD TO OPERATE

[75] Inventors: Kenji Suzuki, Kawasaki; Hirohito Tanabe, Fujisawa, both of Japan

[73] Assignee: Kabushiki Kaisha Toshiba, Kawasaki, Japan

[21] Appl. No.: 332,324

[22] Filed: Apr. 3, 1989

[30] Foreign Application Priority Data

Apr. 5, 1988 [JP] Japan .................................. 63-82340

[51] Int. Cl.⁵ ........................................... H01L 29/78
[52] U.S. Cl. ..................................... 357/23.4; 357/86; 357/89
[58] Field of Search ........................... 357/23.4, 86, 89

[56] References Cited

U.S. PATENT DOCUMENTS 4,729,001  3/1988  Haskell ............................ 357/23.4

FOREIGN PATENT DOCUMENTS 0199293   4/1986  European Pat. Off. .
63-84164  4/1988  Japan .............................. 357/23.4
2155151   3/1984  United Kingdom .............. 357/23.4
2155151A  3/1984  United Kingdom .

Primary Examiner—Edward J. Wojciechowicz
Attorney, Agent, or Firm—Finnegan, Henderson, Farabow, Garrett, and Dunner

[57] ABSTRACT

A semiconductor substrate has on its major surface a N⁻ drain region, within which a P base region is selectively formed. In the P base region is formed a P⁺ base region which has a higher impurity concentration than that of the P base region. A source region is selectively formed across and within the P base region and P⁺ base region. The source region has a lightly doped N source region and a heavily doped N⁺ source region. The N⁺ source region is entirely formed within the P⁺ base region so as not to form an N⁺P junction which is high in emitter injection efficiency and thereby to make a parasitic transistor hard to operate. Furthermore, the N source region is formed smaller in depth than the P⁺ source region so as to decrease the base spreading resistance of the parasitic transistor and thereby to make the parasitic transistor hard to operate. A gate electrode is formed over a channel region, which is a portion of the P base region that is sandwiched between the N⁻ drain region and the N source region and exposed to the major surface of the substrate, with a gate insulating layer interposed therebetween.

9 Claims, 4 Drawing Sheets

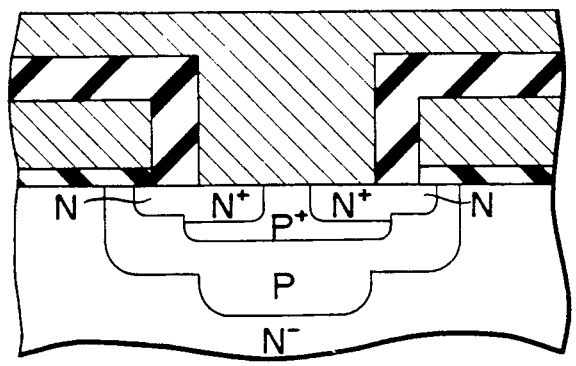
F I G. 6
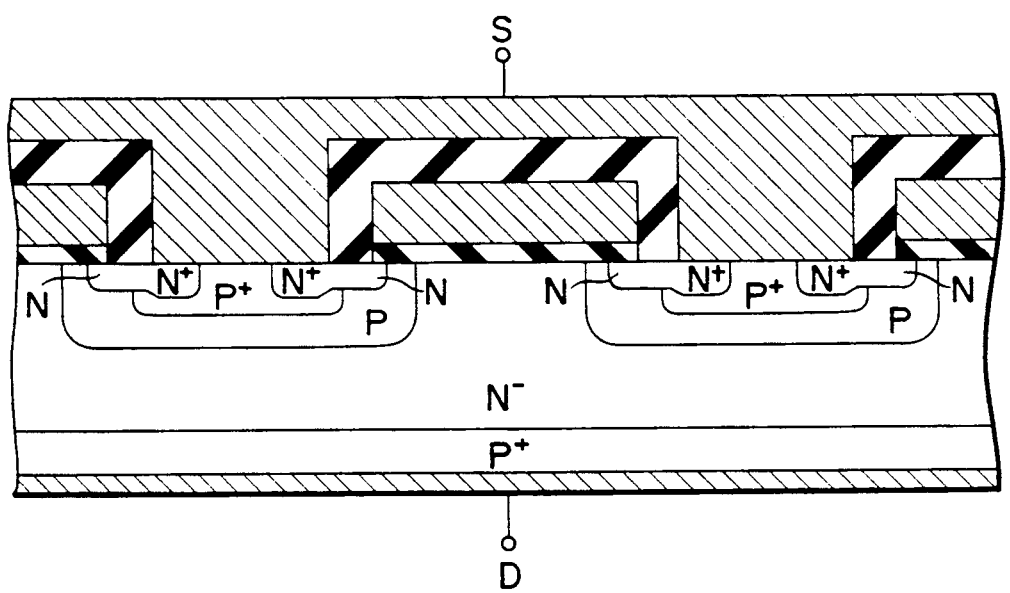
F I G. 7

SEMICONDUCTOR DEVICE HAVING A STRUCTURE WHICH MAKES PARASITIC TRANSISTOR HARD TO OPERATE

BACKGROUND OF THE INVENTION

1. Field of the Invention

The present invention relates to a semiconductor device such as a double-diffused metal-oxide field-effect transistor (MOSFET) and more particularly to a semiconductor device having a structure in which a parasitic transistor formed in the MOSFET is difficult to operate. Furthermore the present invention also relates to a method of manufacturing a semiconductor device having such a structure.

2. Description of the Related Art

In a semiconductor device, such as a double-diffused MOSFET or IGBT (insulated gate bipolar transistor), a parasitic transistor is formed internally. In case where the parasitic transistor operates, functions inherent in the device will be prevented. Depending on operating conditions, the parasitic transistor may lead to breakdown of the device.

The double-diffused MOSFETs are widely used in applications requiring a higher speed of operation than bipolar transistors. For example, the MOSFETs find application in controlling electric motors. The switching of an inductive load, such as an electric motor, may operate a parasitic transistor existing within a MOSFET and thus lead to breakdown of the MOSFET. The reason of the breakdown of the MOSFET is that abrupt variations in voltage and current resulting from switching of the inductive load cause current flow into a base region of the parasitic bipolar transistor, which is thus caused to operate, and excessive current flows locally in the transistor. Therefore, there is a great need for a solution to the problem of to parasitic transistors.

SUMMARY OF THE INVENTION

Accordingly, an object of the present invention is to provide a semiconductor device, such as a double-diffused MOSFET or IGBT, which decreases the operation of a parasitic bipolar transistor in its device, and has an improved in the breakdown quantity.

Another object of the present invention is to provide a method for manufacturing an improved semiconductor device which is resistant to breakdown due to a parasitic transistor.

According to an aspect of the present invention there is provided a semiconductor device comprising a semiconductor substrate having a region of one conductivity type on a major surface thereof, a first base region of opposite conductivity type formed selectively within the region of one conductivity type, a second base region of opposite conductivity type formed selectively within the first base region and having a higher impurity concentration than that of the first base region, a source region of one conductivity type formed across and within the first and second base regions, the source region having a lightly doped region and a heavily doped region, and the heavily doped region being entirely formed within the second base region, and a gate electrode opposed to a channel region with a gate insulating layer interposed therebetween, the channel region being a portion of the first base region that is sandwiched between the region of one conductivity type and the lightly doped region and exposed to the major surface of the semiconductor substrate.

According to another aspect of the present invention there is provided a method of manufacturing a semiconductor device, comprising the steps of forming a region of one conductivity type on a major surface of a semiconductor substrate, depositing a polysilicon layer over the region of one conductivity type with an insulating layer interposed therebetween and forming a gate insulating layer and a gate electrode by selective etching, forming a first base region of opposite conductivity type within the region of one conductivity type by diffusing impurities, forming an opening for the subsequent formation of a second base region of opposite conductivity type within the first base region and diffusing impurities through said opening to form the second base region of opposite conductivity type, the second base region having a higher impurity concentration than that of the first base region and a smaller depth than that of the first base region, forming a highly doped source region within the second base region by diffusing impurities, the heavily doped source region being entirely formed within the second base region, forming a lightly doped source region within the first base region by diffusing impurities so as to communicate with the heavily doped source region, and forming a source electrode to cover the gate electrode with an interlayer insulating layer interposed therebetween and to make ohmic contact with the heavily doped source region and the second base region.

BRIEF DESCRIPTION OF THE DRAWINGS

FIG. 6 is a sectional view of a double-diffused MOSFET according to a fourth embodiment of the present invention; and FIG. 7 is a sectional view of an IGBT according to a fifth embodiment of the present invention.

DETAILED DESCRIPTION OF THE PREFERRED EMBODIMENTS

Figure 1:
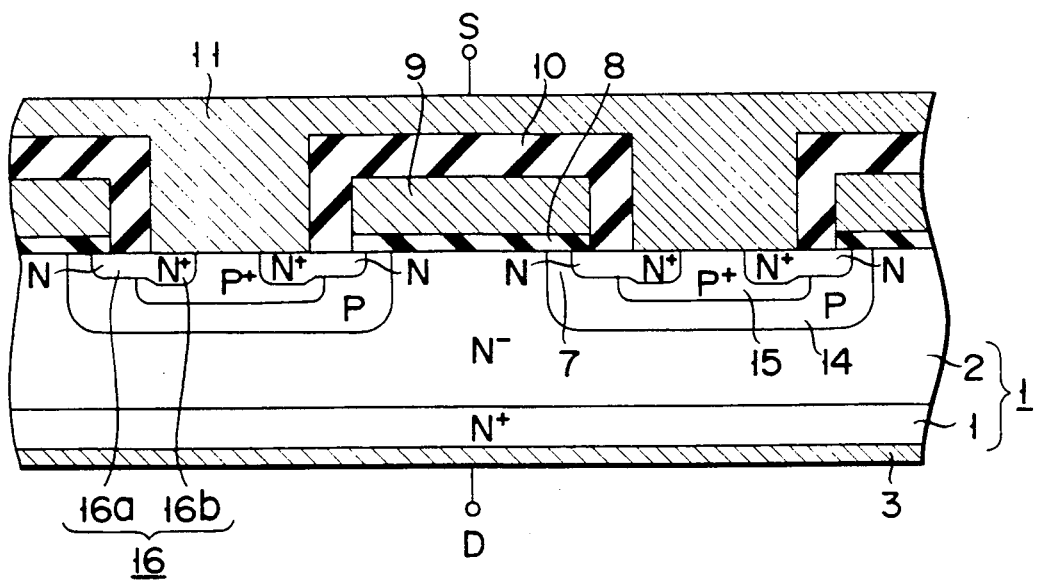
FIG. 1 is a sectional view of a double-diffused MOSFET according to a first embodiment of the present invention.

A first embodiment of the present invention will now be described with reference to FIG. 1. A semiconductor substrate 1 has a region of one conductivity type on its major surface. In the present embodiment, an N$^-$ type epitaxial layer (referred to as an N$^-$ drain region hereinafter) 2 is deposited on a heavily-doped substrate 1 of N type conductivity (referred to as an N$^+$ substrate hereinafter) to form the substrate which is generally indicated at 1. A drain electrode 3 is formed on the other major surface of substrate 1. First base regions 14 (referred to as P base regions hereinafter) of opposite conductivity type are formed within N$^-$ drain region 2 by selective diffusion of impurities. Furthermore, within each of P base regions 14 is formed a second base region (referred to as a P+ base region hereinafter) 15 of opposite conductivity type whose impurity concentration is higher than that of P base region 14.

A source region 16 of one conductivity type is formed across P base region 14 and P+ base region 15. Source region 16 is formed of a lightly doped region (referred to as an N source region hereinafter) 16a and a heavily doped region (referred to as an N+ source region hereinafter) 16b. The entire region of N+ source region 16b and part of N source region 16a are formed within P+ base region 15.

Over a channel region 7 of P base region 14 that is sandwiched between N source region 16a and N− drain region 2 are sequentially formed a gate oxide layer 8 and a gate electrode 9. An interlayer insulation layer 10 is formed over gate electrode 9, and a source electrode 11 is formed to surround gate electrode 9 with interlayer insulating layer 10 interposed therebetween and moreover to make ohmic contact with N+ base region 16b and P+ base region 15.

Figure 2A:
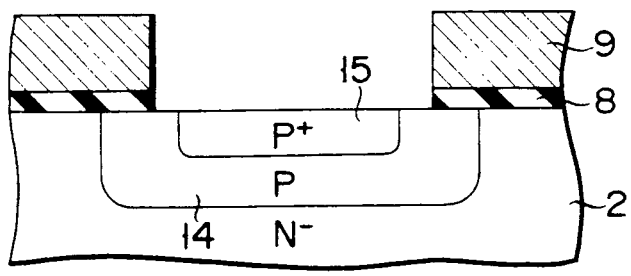
FIGS. 2A to 2C illustrate a series of steps, in section, of manufacture of the MOSFET of FIG. 1.
Figure 2B:
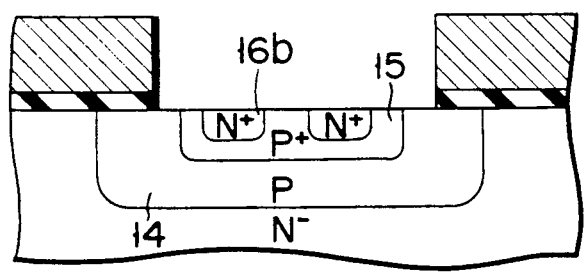
Figure 2C:
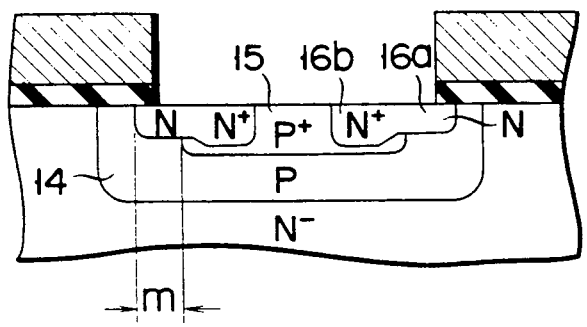

A method of manufacturing of the above MOSFET will now be outlined with reference to FIGS. 2A to 2C. First, epitaxial layer 2 is deposited over N+ substrate 1 by epitaxial growth. Subsequently an oxide layer is formed over the surface of N− epitaxial layer 2 and an opening is formed in the oxide layer by using a photo etching technique for subsequent gate oxidation. A polysilicon layer is subsequently deposited thereover and, by using photo etching techniques, gate oxide layer 8 and gate electrode 9 are formed. Subsequently by using gate electrode 9 consisting of the polysilicon layer as a mask, impurities, for example, boron (B) are diffused to form P base region 14. P base region 14 has a surface impurity concentration of about $10^{17}$ atoms/cm$^3$. An opening corresponding to a P+ forming region is formed and then impurities are introduced through the opening to form P+ base region 15 within P base region 14. P+ base region 15 has a surface impurity concentration of $10^{19}$ atoms/cm$^3$ or more, for example, $5 \times 10^{19}$ atoms/cm$^3$. The semiconductor structure obtained to this point is shown in FIG. 2A.

By using a conventional technique, N+ source regions 16b are subsequently formed within P+ base region 15 by diffusion of impurities. N+ base regions 16b have a surface impurity concentration of $10^{19}$ atoms/cm$^3$ or more, for example, $5 \times 10^{19}$ atoms/cm$^3$. The depth of N+ source region 16b is 1 μm or below, for example, 0.5 μm. The semiconductor structure obtained to this point is shown in FIG. 2B.

Subsequently, by using a conventional technique, N source regions 16a of low impurity concentration are formed by diffusion of impurities across P base region 14 and P+ base region so as t communicate with corresponding N+ base regions 16b. N source regions 16a have a surface impurity concentration in the range of $10^{18}$ to $10^{19}$ atoms/cm$^3$. The depth of N source region 16a is 0.5 μm or below, for example, 0.3 μm. N source region 16a should be as small as possible in depth. The semiconductor structure obtained to this point is shown in FIG. 2C.

Interlayer insulating layer 10 is subsequently formed and then a contact opening is formed in the insulating layer. The subsequent formation of source electrode 11 results in the structure of the MOSFET shown in FIG. 1.

Figure 3:
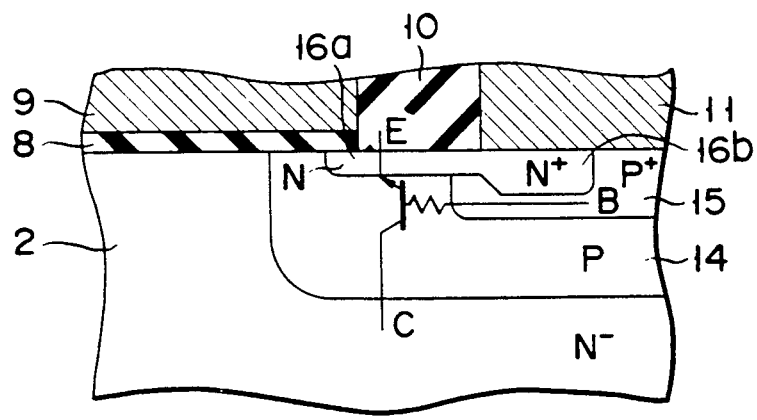
FIG. 3 is a sectional view of the principal part of a parasitic transistor of the double-diffused MOSFET of FIG. 1.

The MOSFET thus formed involves a parasitic bipolar transistor as described above. In FIG. 3 there is shown a partial sectional view of the MOSFET involving the parasitic transistor and an equivalent circuit of the parasitic transistor overwirtten in a corresponding position thereof. That is, there is formed parasitic bipolar transistor in which source region 16 serves as its emitter region, P+ base region serves as its base region, and N− drain region 2 serves as its collector region.

The source region of a conventional MOSFET is formed by one diffusion process at a high impurity concentration so as to have good contact with the source electrode. Thus, the source regions formed within the P base region will also have a high impurity concentration. It is to be noted here that the more the impurity concentration of the source region increases, the more the emitted injection efficiency of the parasitic bipolar transistor increases. Thus the conventional MOSFET is large in emitter injection efficiency because of its heavily doped source region. The parasitic bipolar transistor is thus easy to operate. Since the source region is heavily doped, the depth thereof becomes large and the base spreading resistance increases. As a result, the parasitic bipolar transistor becomes easier to operate.

The present invention is characterized in that source region 16 is formed of N source region 16a and N+ source region 16b, and the entire region of N+ source region 16b is formed within P+ base region 15. In the present invention, by forming N source region 16a within P base region 14 and N+ source region 16b within P+ base region 15 separately, N+ source region 16b contacting source electrode 11 can be formed at a much higher impurity concentration than in conventional transistors. Therefore, the resistance of ohmic contact between N+ source region 16b and source electrode 11 decreases, thus producing a MOSFET which is large in forward transfer admittance ($g_m$). N source region 16a formed within P base region 14, on the other hand, is low in impurity concentration as compared with N+ source region 16b, so that the depth of N source region 16a within P base region 14 becomes smaller than that of the N+ source region of the conventional MOSFET. As a result, the spreading resistance within P base region 14 also becomes smaller than in conventional transistors, thus making the operation of the parasitic bipolar transistor much harder than in conventional transistors. N source region 16a is lightly doped, thus suppressing the emitter injection efficiency of the parasitic bipolar transistor lower than conventional. Thus, the parasitic bipolar transistor becomes much harder to operate. According to the present invention, as described above, since the emitter injection efficiency as well as the spreading resistance can be made small, the parasitic bipolar transistor can be made much harder to operate than in the conventional semiconductor device.

Figure 4:
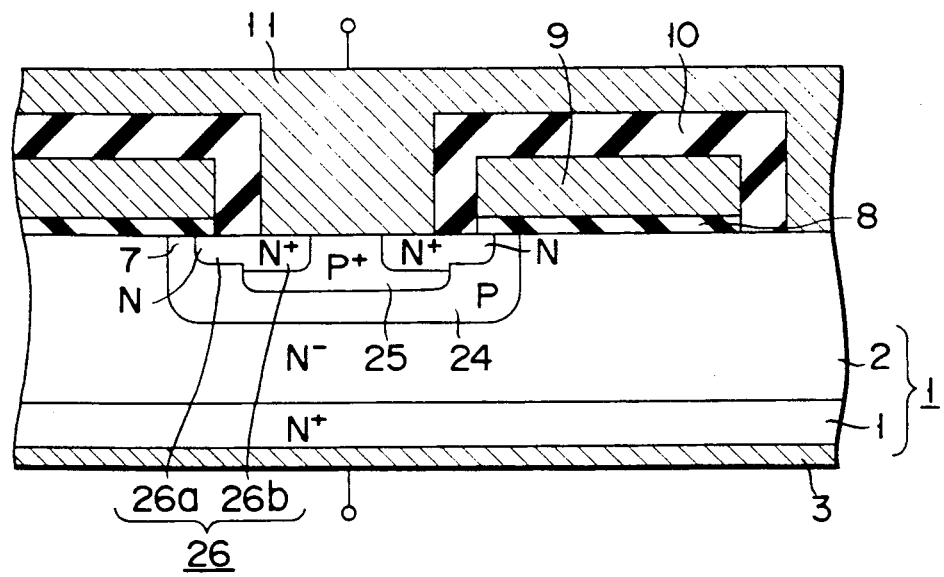
FIG. 4 is a sectional view of a double-diffused MOSFET according to a second embodiment of the present invention.

FIG. 4 shows a second embodiment of the present invention, in which like characters are used to designate like parts in FIG. 1 and description thereof is omitted. The second embodiment is the same as the first embodiment so far described in that source region 26 is formed of N source region 26a and N+ source region 26b. However, the first and second embodiments are distinguished from each other in that, in the first embodiment, N source region 16a is formed within both P base region 14 are P+ base region 15, whereas, in the second embodiment, the whole N source region 26a is formed within P base region 24. That is, the whole N source region 26a and the whole N+ source region 26b are formed within P base region 24 and P+ base region 25, respectively. With such an arrangement, the same effect as that achieved with the first embodiment can be obtained.

Figure 5:
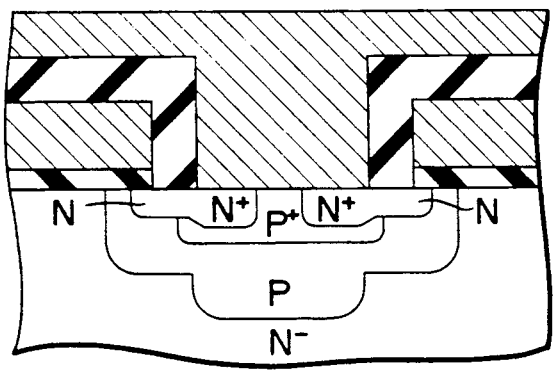
FIG. 5 is a sectional view of a double-diffused MOSFET according to a third embodiment of the present invention.

FIGS. 5 and 6 show third and fourth embodiments, respectively, of the present invention in which the P base region is formed in two steps. With respect to the source region, the third embodiment is the same as the first embodiment of FIG. 1, while the fourth embodiment is the same as the second embodiment of FIG. 4. By making the P base region deeper as in the third and fourth embodiments, the spreading resistance can be decreased further. Therefore, the third and fourth embodiments have an advantage over the first embodiment.

By applying a manufacturing method disclosed in Japanese patent application No. 61-277856 to the semiconductor device of the present invention, it is possible to minimize the distance m between a lateral surface of P+ base region 15 and a lateral surface of N source region 16a, that is shown in FIG. 2C. By using the above method in which gate electrode 9, serving as a double-diffusion mask for N source region 16a and P+ base region 14, and an impurity diffusion window for P+ base region 15 are separately formed in a self-aligned manner, P+ base region 15 can be formed right below N+ source region 16b. As a result, it becomes possible to minimize the distance m without an influence of the impurity concentration of P+ base region 15 upon the impurity concentration of channel region 7 that determines a gate threshold voltage. As described above, since the base spreading resistance can be decreased as the distance m decreases, the parasitic transistor becomes much harder to operate, thereby providing a desirable effect.

Although the above embodiments have been described with respect to the N-channel MOSFET, the present invention may be applied to a P-channel MOSFET in which the P-type conductivity and the N-type conductivity are replaced with each other. Moreover the present invention is also applicable to an IGBT in which a P+ type region is added to the lower major surface of a semiconductor substrate of a double-diffused vertical MOSFET as shown in FIG. 7.

In the semiconductor device of the present invention, as detailed above, source region 16 has a communicating structure of a lightly doped region and a heavily doped region, and the lightly doped source region 16a is formed within P base region 14 in which the parasitic transistor action take places mainly, while the heavily doped source region 16b is entirely formed within P+ base region 15. As a result, the emitter injection efficiency of the parasitic bipolar transistor can be kept low and moreover the base spreading resistance decreases, so that the parasitic bipolar transistor becomes hard to operate. Accordingly, it becomes difficult for breakdown due to the parasitic bipolar transistor action to take place, thus providing a semiconductor device which is very resistant to the breakdown. Furthermore, in the present invention, since the impurity concentration of the heavily doped source region can be made sufficiently high, the characteristics of the semiconductor device, such as forward transfer admittance ($g_m$), can be improved.

What is claimed is:

1. A semiconductor device comprising:
   a semiconductor substrate having a first region of one conductivity type on a major surface thereof;
   a drain electrode formed on another major surface of said semiconductor substrate electrically connected to said first region;
   a first base region of opposite conductivity type formed selectively within said first region of one conductivity type and having a first impurity concentration;
   a second base region of opposite conductivity type formed selectively within said first base region and having a second impurity concentration which is higher than said first impurity concentration;
   a first source region of one conductivity type formed selectively within said first base region and having a third impurity concentration;
   a second source region of one conductivity type contiguous with the first source region formed within said second base region, said second source region having a fourth impurity concentration which is higher than the third impurity concentration;
   a source electrode formed in ohmic contact with both said second base region and said second source region; and
   a gate electrode opposed to a channel region with a gate insulating layer interposed therebetween, said channel region being a portion of said first base region that is sandwiched between said first region and said first source region and exposed to the major surface of said semiconductor substrate.

2. The semiconductor device according to claim 1, wherein said first source region is smaller in depth than said second source region.

3. The semiconductor device according to claim 2, wherein the depth of said first source region is 0.5 $\mu$m or below, and that the depth of said second source region is 1 $\mu$m or below.

4. The semiconductor device according to claim 1, wherein said first source region is partly formed within said second base region.

5. The semiconductor device according to claim 1, wherein said second source region has a surface impurity concentration of $10^{19}$ atoms/cm$^3$ or more.

6. The semiconductor device according to claim 5, wherein said second source region has a surface impurity concentration of $5 \times 10^{19}$ atoms/cm$^3$.

7. The semiconductor device according to claim 1, wherein said first source region has a surface impurity concentration in a range from $10^{18}$ atoms/cm$^3$ to $10^{19}$ atoms/cm$^3$.

8. The semiconductor device according to claim 1, wherein said first base region is deeper than said second base region.

9. A semiconductor device comprising:
   a semiconductor substrate having a first drain region of one conductivity type on a major surface thereof;
   a first base region of opposite conductivity type formed selectively within said first drain region of one conductivity type and having a first impurity concentration;
   a second base region of opposite conductivity type formed selectively within said first base region and having a second impurity concentration which is higher than said first impurity concentration;
   a first source region of one conductivity type formed selectively within said first base region and having a third impurity concentration;
   a second source region of one conductivity type contiguous with the first source region formed within said second base region, said second source region having a fourth impurity concentration which is higher than the third impurity concentration;
a gate electrode opposed to a channel region with a gate insulation layer interposed therebetween, said channel region being a portion of said first base region that is sandwiched between said first region and said first source region and exposed to the major surface of said semiconductor substrate.

* * * * *